(12) United States Patent
Chan et al.

(10) Patent No.: US 6,868,000 B2
(45) Date of Patent: Mar. 15, 2005

(54) COUPLED BODY CONTACTS FOR SOI DIFFERENTIAL CIRCUITS

(75) Inventors: Yuen H. Chan, Poughkeepsie, NY (US); Rajiv V. Joshi, Yorktown Heights, NY (US); Antonio R. Pelella, Highland Falls, NY (US)

(73) Assignee: International Business Machines Corp., Armonk, NY (US)

( * ) Notice: Subject to any disclaimer, the term of this patent is extended or adjusted under 35 U.S.C. 154(b) by 0 days.

(21) Appl. No.: 10/436,432

(22) Filed: May 12, 2003

(65) Prior Publication Data

US 2004/0228160 A1 Nov. 18, 2004

(51) Int. Cl.[7] .............................................. G11C 11/00
(52) U.S. Cl. ................... 365/154; 365/205; 365/230.06
(58) Field of Search ................................ 365/154, 205, 365/230.06, 156, 185.01, 177

(56) References Cited

U.S. PATENT DOCUMENTS

| 5,898,617 A | * | 4/1999 | Bushey et al. ............ 365/185.2 |
| 6,061,268 A | * | 5/2000 | Kuo et al. ................... 365/156 |
| 6,724,681 B2 | * | 4/2004 | Terzioglu et al. ...... 365/230.06 |

* cited by examiner

*Primary Examiner*—David Lam
(74) *Attorney, Agent, or Firm*—Law Office of Charles W. Peterson, Jr.; Louis J. Percello

(57) ABSTRACT

A silicon on insulator (SOI) CMOS circuit, macro and integrated circuit (IC) chip. The chip or macro may include be an SRAM in partially depleted (PD) SOI CMOS. Most field effect transistors (FETs) do not have body contacts. FETs otherwise exhibiting a sensitivity to history effects have body contacts. The body contact for each such FET is connected to at least one other body contact. A back bias voltage may be provided to selected FETs.

31 Claims, 4 Drawing Sheets

COUPLED BODY CONTACTS FOR SOI DIFFERENTIAL CIRCUITS

FIELD OF THE INVENTION

The present invention relates to semiconductor integrated circuit and, more particularly to very large scale integrated (VLSI) circuits wherein field effect transistors (FETs) are formed in a surface layer of a silicon on insulator (SOI) chip.

BACKGROUND DESCRIPTION

Bulk silicon field effect transistors (FETs) are formed on the surface of a silicon chip or wafer. In what is typically referred to as CMOS technology, the silicon wafer or substrate may be of one conduction type, e.g., P-type, and areas or wells of a second conduction type, e.g., N-type, are formed in the P-type wafer. N-type FETs (NFETs) are formed on the surface of the P-type wafer and P-type FETs (PFETs) are formed on the surface of the N-wells. FET device characteristics, including threshold voltage ($V_t$) and device currents, are dependent upon device substrate voltage ($V_{sx}$). So, typically, a first bias voltage, typically zero Volts (0V) or ground (GND), is applied to the substrate to bias the NFETs and a second bias voltage, typically the supply voltage ($V_{dd}$ or $V_{hi}$), is applied to the N-wells. The substrate and N-well bias (or, collectively, back bias) voltages help to stabilize respective FET electrical characteristics, including improving $V_t$ and device current stability. Changing a device bias conditions changes device characteristics; increasing/decreasing device $V_t$ and decreasing/increasing device operating current depending upon the magnitude and direction of the respective change.

Performance improvements for these prior art bulk transistor technologies has been achieved, primarily, by reducing feature size or "scaling." More recently, silicon on insulator (SOI) technology has become the main source of performance improvement for transistors. SOI transistors may be formed on the surface of a silicon layer isolated from a silicon substrate by a buried oxide (BOX) layer. In a typically complex series of mask steps, shallow trenches filled with oxide isolate SOI islands of the surface silicon layer on which FETs are formed. Circuit wiring in layers above the FETs connects the FETs into circuits. The state of the art, partially depleted (PD) SOI technology includes a semiconductor layer thick enough that, the FET channel region does not fully deplete through its full thickness when the device is off. The advantage of the PD SOI structure is that device operation and design are very close to bulk CMOS.

Ideally, each FET is isolated from unintended parasitic effects from every other FET. Back biases may be applied to SOI FETs through a contact to the underlying layer (or body contact) that may require as much area as the FET itself and may make circuit wiring more difficult. Consequently, especially for dense SOI memory arrays, body contacts are omitted completely for maximum device density. Unfortunately, as body contacts are eliminated or at the very least shared by more and more devices, individual devices become much more susceptible to localized device phenomena known as body effects. Localized body effect variations cause device non-uniformity.

Body effects, also known as history effects, occur in completely or partially isolated devices, especially in analog logic circuit FETs, memory devices (FETs) or in logic where device body contacts may be infrequent or eliminated. As a particular device switches off, charge (i.e., majority carriers) remains in the device body beneath the channel. Device leakage and parasitic bipolar effects may add to the charge. Charge builds at isolated locations as the chip operates because the charge from fast switching devices is injected into locally isolated body pockets faster than it dissipates. Eventually, the injected charge reaches some steady state value that acts as a substrate bias for the device. This steady state change depends upon each particular device's switching history and is typically known as the history effect for the particular device. So, body effects may cause two devices that are identical by design may exhibit some difference, difference that may be time varying from changing circuit conditions. Normally, slight variations in device characteristics such as device thresholds, are negligible, neglectable and not given much consideration for typical logic circuits such as decoders, clock buffers, input or output drivers and array output drivers.

These localized body effects and other sporadically occurring parasitic bipolar effects, i.e., at source/drain diffusion junctions, are serious design problems for densely packed SOI circuits such as for example, memory arrays, e.g., a Static RAM (SRAM) macro. A SRAM cell is, essentially, an identical pair of cross coupled transistors loaded with high resistance load resistors and a pair of pass transistors between internal storage nodes and a pair of bit lines. The state of the cross coupled pair determines the state of data stored in the cell. Each SRAM cell is read by coupling the cross coupled transistors through the access transistors to the bit line pair and measuring the resulting voltage difference on the bit line pair. The signal on the bit line pair increases with time toward a final state wherein each one of the pair may be, ultimately, a full up level and a full down level. However, to improve performance, the voltage difference is sensed well before the difference reaches its ultimate value.

Thus, the channel bias of any device is dependent upon its current operating state and the device's history, i.e., any previously introduced remaining charge. Charge in any particular device may vary as the chip operates because individual devices switch somewhat independently of each other. As noted above, FET device characteristics are dependent upon device substrate voltage. For typical individual logic circuits such as, decoders, clock buffers, input or output drivers and array output drivers, device characteristics variations that result from floating device channels, may be negligible, neglectable and given little consideration.

However, repetitively accessing RAM cells, both to read and to write, unintentionally induces local body effects in some cell devices. These body effects change cell device thresholds and modulate device currents for affected devices, reducing the signal stored in the cell as well as the signal passed by cell access transistors. These local effects can cause the SRAM cell to favor one state over the other, resulting in sporadic read upsets with no apparent reason. An imbalance in cell pass gates may increase cell write time and sense time. As a result, intermittent problems may arise, such as spuriously reading the wrong data or, random cell failures. These types of intermittent problems are notoriously difficult to identify and diagnose. So, channel bias variations from body effects causes device non-uniformities that result in difficult to identify sporadic chip failures sometimes characterized as "soft failures."

Dynamic circuits are Especially sensitive to such process variations which can result in inter or intra macro timing problems, race conditions, high leakage/power and reduced noise margins. In analog circuits (e.g., SRAM sense amplifiers) device body voltages can drift from cycle to cycle. Consequently, such chips, macros and other circuits with threshold variation sensitivities, either have performance and reliability below what it might be with back biased devices or, are larger (and so, more expensive) than they might otherwise be if body contacts were not included.

Thus, there is a need for a improved SOI device stability and especially for SRAM devices.

OBJECTS OF THE INVENTION

It is a purpose of the present invention to improve integrated circuit design;

It is another purpose of the present invention to reduce body effects for SOI devices;

It is yet another purpose of the present invention to improve SOI SRAM balanced device tracking;

It is yet another purpose of the present invention to improve SOI sense amplifier noise margin;

It is yet another purpose of the present invention to reduce body effects in SOI SRAM sense amplifiers.

SUMMARY OF THE INVENTION

The present invention relates to a silicon on insulator (SOI) CMOS circuit, macro and integrated circuit (IC) chip. The chip or macro may include be an SRAM in partially depleted (PD) SOI CMOS. Most field effect transistors (FETs) do not have body contacts. FETs otherwise exhibiting a sensitivity to history effects have body contacts. The body contact for each such FET is connected to at least one other body contact. A back bias voltage may be provided to selected FETs.

BRIEF DESCRIPTION OF THE FIGURES

The foregoing and other objects, aspects and advantages will be better understood from the following detailed preferred embodiment description with reference to the drawings, in which.

DETAILED DESCRIPTION OF PREFERRED EMBODIMENTS

Figure 1:
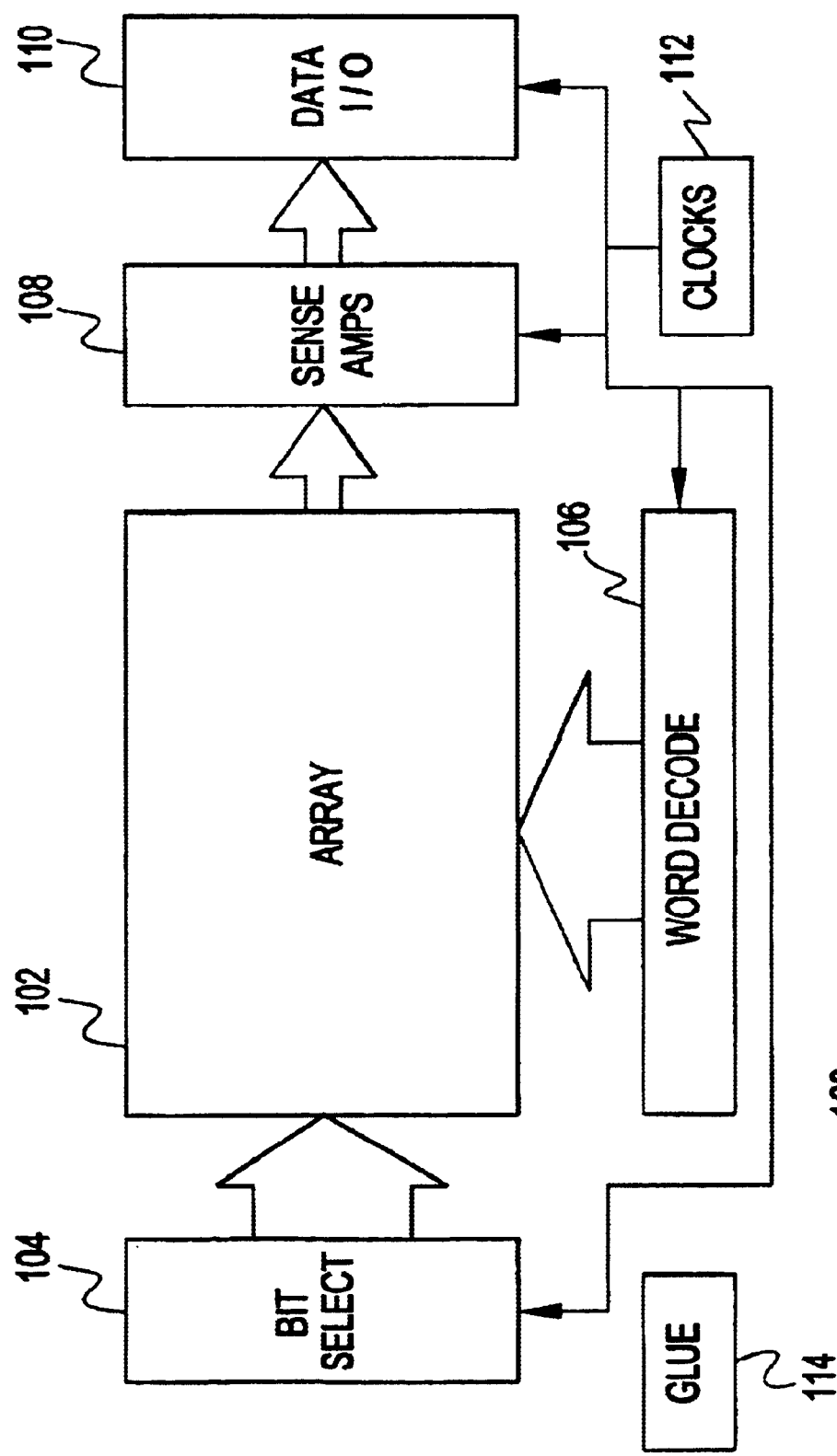
FIG. 1 shows an example of a block diagram of a memory, macro or chip, wherein back bias contacts are provided only to selected devices and otherwise not included.

Referring now to the drawings, and more particularly, FIG. 1 shows an example of a block diagram of a memory 100, macro or chip, according to a preferred embodiment of the present invention, wherein back bias contacts are provided only to selected devices and, otherwise, not included. In this example, cells (not shown) of an array 102 are selected by coincidence a column selected by bit select circuit 104 with a row selected by word decoder 106. Selected cells are couple to sense amplifiers 108 for reading data stored in cells during a read. Data from the sense amplifiers 108 are passed to data input/output (I/O) drivers 110. Body contacts are provided only for selected devices, e.g., in each of the bit select 104 and the sense amplifiers 106. Clock logic 112 provides local timing and glue logic 114 provides local control logic. Optionally, selected devices can be identified in each of the remaining circuits, including word decode 108, clocks 112 and glue 114. Typically, however, devices do not include body contacts and so, have floating channels.

In this example, the array 102 is an array of well known six transistor (6T) latches or storage cells (not shown). More particularly, the storage array may be a typical CMOS SRAM in what is known as partially depleted (PD) silicon on insulator (SOI) technology, where typical devices do not include body contacts. While application of the present invention is advantageous to almost any technology or any SOI CMOS circuit, it is most advantageous in PD SOI CMOS analog circuits such as may be found in SRAMs to selectively reduce history effects in particular devices.

Figure 2:
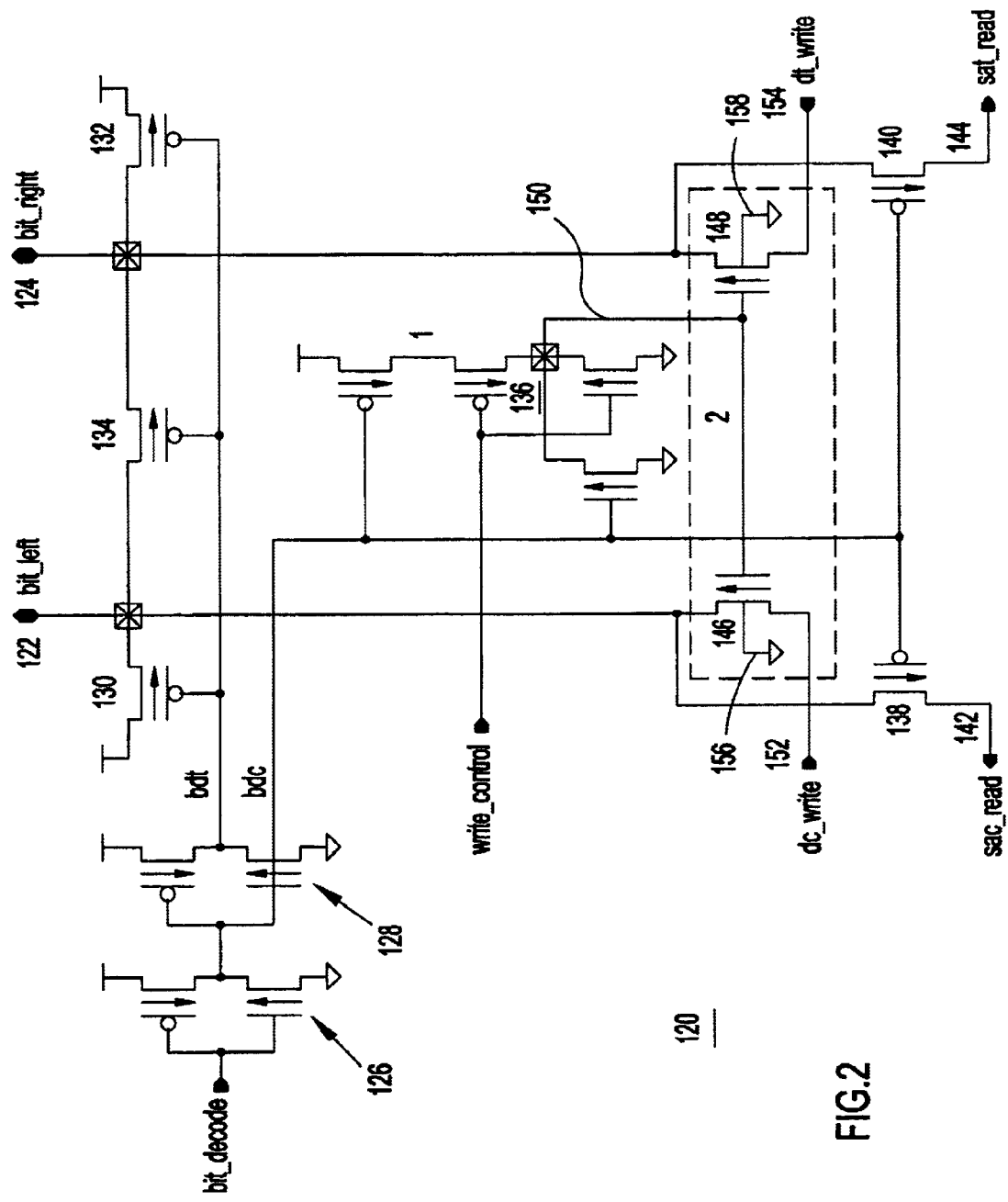
FIG. 2 shows an example of a bit select driver for a bit line pair.

FIG. 2 shows an example of a column select driver 120 for a complementary bit line pair 122, 124. A bit line restore circuit includes a pair of series connected inverters 126, 128. The first inverter 126 receives a decoded column select signal (e.g., 1 of 32, 64 or 256) from a typical bit address decoder. The second inverter 128 drives bit line pull up devices, PFETs 130, 132, and an equalization device, PFET 134. The output of the first inverter 126 is an input to a 2 input NOR gate 136 and drives a pair of bit line select pass gates, PFETs 138, 140, which are read pass gates, passing a complementary signal on the selected bit line pair 122, 124 to a sense amplifier (108 in FIG. 1) during a read on complementary data line pair 142, 144, respectively. A write control signal is a second input to the 2 input NOR gate 136. A pair of write devices, NFETs 146, 148, are driven by the output 150 of 2 input NOR gate 136, selectively coupling complementary input data on data write pair 152, 154 to bit line pair 122, 124, respectively. In this example body contacts 156, 158 are provided only at data write pair 146, 148, respectively, and not to the remaining devices which are much less sensitive to history effects. Thus, extra body contact space is limited to what is required for body contacts 156, 158.

In a typical access, an array word line (not shown) is driven high selecting a row of cells and a selected column signal is driven high at the input to the corresponding first inverter 126 to select one column. The output of the first inverter 126 falls and the output of the second inverter 128 rises. The high turns off bit line pull up devices 130, 132 and equalization device 134, floating the bit line pair 122, 124, allowing a signal to develop. The low on bit line select pass gates 138, 140 couples the bit line pair 122, 124 to the data line pair 142, 144. During a read, the write input to NOR gate 136 remains high. So, the write devices 146, 148 remain off because the output of NOR gate 136 is low. During a write, the write input to NOR gate 136 is low. So, the write devices 146, 148 turn on when the output first inverter falls, driving the output of NOR gate 136 high. With the write devices 146, 148 on, data passes from data write pair 152, 154 to the bit line pair 122, 124.

In this example, write devices 146, 148 operate during a write in what is commonly known as "source follower mode." Prior to a write operation, the bit lines 122, 124 are pre-charged high. During each write, the write devices 146, 148 are biased such that bit line charge passes from one of the selected bit lines 122, 124 to whichever one of the corresponding data line pair is low. As a result, when each of the write devices 146, 148 switches to its active state, without corresponding body contacts 156, 158 a large unintended bipolar current pulse results. This current pulse inject charge that shifts the particular device's $V_t$ to reduce the devices' 146, 148 current capability and, as a result, the signal that is passed to the bit line pair 122, 124 during the allotted write time or, the "Write Margin." By contrast, the body contacts 156, 158 provide a path for the current, preventing this write margin degradation by leaking any body charge that might develop in the write devices 146, 148 to ground. It should be noted that although the present invention is described in terms of selectively providing body contacts, the same result can be effected by selectively omitting contacts except where they are determined to be necessary.

Figure 3:
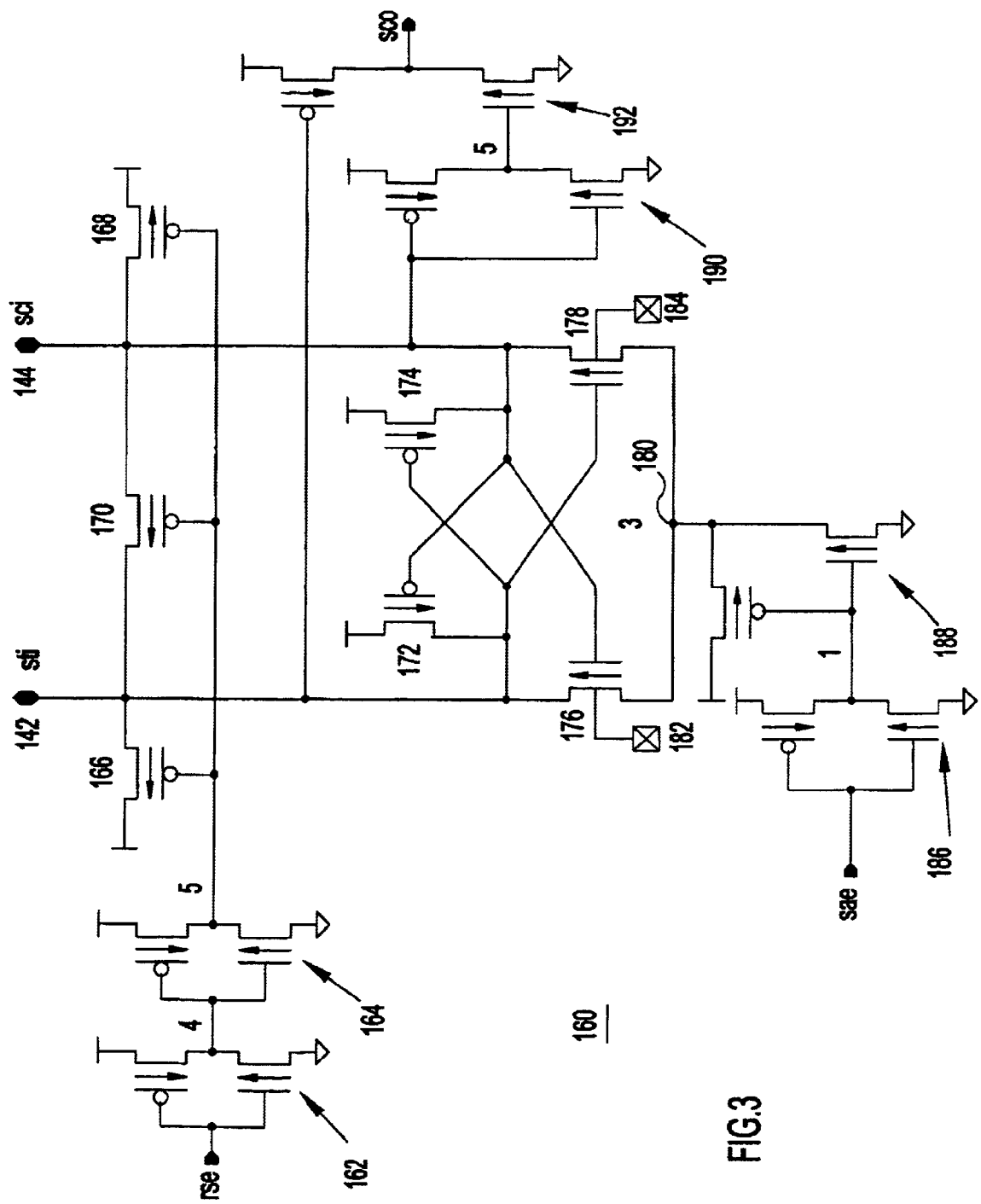
FIG. 3 shows an example of a sense amplifier sensing data on data line pair.

FIG. 3 shows an example of a sense amplifier 160 sensing data on data line pair 142, 144. A data line restore circuit includes a pair of series connected inverters 162, 164. The first inverter 162 receives a restore select signal. The second inverter 164 drives data line pull up devices, PFETs 166, 168, and an equalization device, PFET 170. The sense amplifier includes a pair of cross coupled identical PFETs 172, 174 connected between a supply voltage ($V_{dd}$ in this example) and data line pair 142, 144; and, a pair of cross coupled identical NFETs 176, 178 connected between a sense enable node 180 and data line pair 142, 144. By design, the PFET 172 and NFET 176 are identical and symmetrical with PFET 174 and NFET 178. In this example body contacts 182, 184 are provided only at cross coupled NFET pair 176, 178, respectively, and not to the remaining devices which are much less sensitive to history effects. Further, in this example, although the body contacts 182, 184 are connected together, they are not connected to a supply voltage, but are allowed to float such that injected charge is shared by both devices 176, 178, equally, maintaining balance in the two devices 176, 178. A pair of series connected sense enable inverters 186, 188 drive sense enable node 180 in response to a sense enable signal a the input of the first inverter 186. Data line 144 is provided to an inverter 190. The output of inverter 190 and data line 142 are inputs to a tristatable driver 192.

In standby the restore select signal to inverter 162 is low and so, the gates of data line pull up devices, PFETs 166, 168, and an equalization device, PFET 170 are low, pulling the data line pair 142, 144 high and shorting them together. The sense enable signal to the input of inverter 186 is high and, correspondingly, sense enable node 180 is high. Since both data lines 142, 144 are high, the output of inverter 190 is low and both devices of complementary input driver 192 are off, tri-stating and floating its output. When a cell is being accessed, the restore select signal to inverter 162 is driven high, driving high the gates of data line pull up devices, PFETs 166, 168, and an equalization device, PFET 170, turning PFETs 166, 168, 170 off, floating the data line pair 142, 144. One of the data line pair 142, 144 droops, developing a difference signal. During a read access, the sense enable signal is pulled low at the gate of the first sense enable inverter 186. The output of sense enable inverter 186 rises turning on NFET 188N (as PFET 188P turns off) in the second inverter 188, which pulls sense enable node 180 to pass ground to the cross coupled NFETs 176, 178. With ground provided to cross coupled NFETs 176, 178, cross coupled PFETs 172, 174 and cross coupled NFETs 176, 178 act as cross coupled inverters in a latch, predispositioned to set by the difference signal on data line pair 142, 144. The magnitude of the read signal necessary to set the latch depends upon how closely matched the PFET 172 and NFET 176 are with PFET 174 and NFET 178.

In a prior art sense amplifier with local body contacts 182, 184 omitted, leakage current from history effects in sense amplifier NFETs 176, 178 could cause the sense amplifier to self-trigger or, with sufficient threshold shift to set with the wrong value. However, for the preferred embodiment sense amplifier 160, the bodies of both devices are shorted together such that charge in one, e.g., 176, is redistributed into the other 178, maintaining device symmetry and minimizing history effects. Further, although sensing is primarily by NFETs 176, 178 and since any imbalance in PFETs 172, 174 normally manifests well after the NFETs 176, 178 are set, optionally, body contacts may be provided at PFETs 172, 174 connecting the bodies of those two FETs together.

Figure 4:
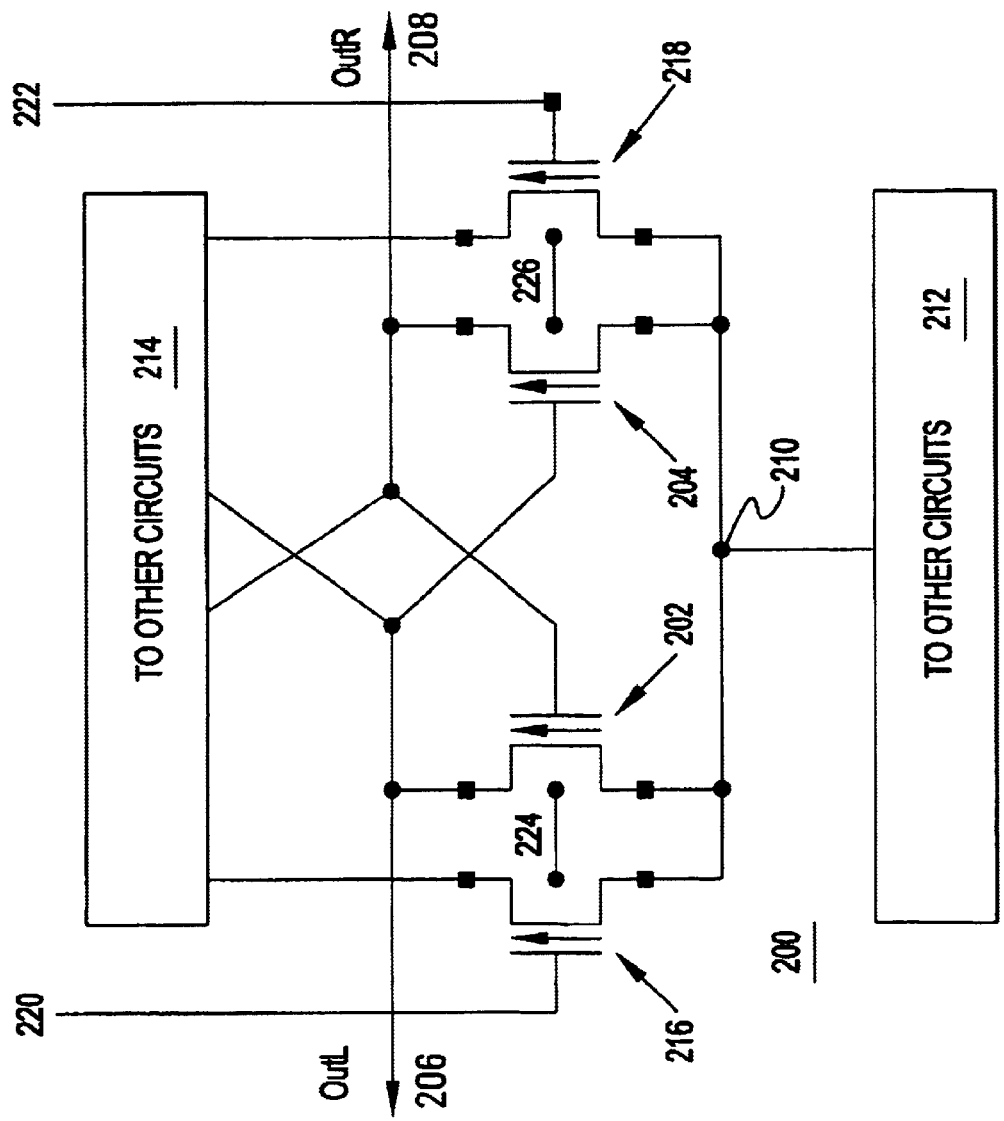
FIG. 4 shows a generic example of a high performance differential circuit.

FIG. 4 shows a generic example of a high performance differential circuit 200. In this example a pair of cross coupled NFETs 202, 204 are each connected between complementary outputs 206, 208 and a common source node 210, e.g., an enable or select node, enabled by enable logic 212. The complementary outputs 206, 208 are also connected to other logic 214, e.g., current mirror driven PFET loads (not shown). A pair of input NFETs 216, 218 between common source node 210 and other logic 214, e.g., PFETs (not shown) tied as diodes, gate to drain and driving current mirror PFET loads at cross coupled NFETs 202, 204. Complementary inputs 220, 222 are provided to the gates of input NFETs 216, 218. Body contact jumpers 224, 226 are provided to each of NFETs 202, 204, 216, 218 and bodies are connected together for corresponding NFETs 202, 216 and 204, 218.

So, for example, a signal may develop on complementary input lines 220, 222 at input NFETs 216, 218. Enable logic 212 pulls common source node 210 low. Whichever complementary input line 220, 222, e.g., 222, is higher causes higher current flow through the corresponding NFET 218. The higher current is reflected in the current mirror load PFET, causing the cross coupled NFETs 202, 204 to latch in phase with the inputs, i.e., with the drain of NFET 204 high and the drain of NFET 202 low in this example. Again, without local body contact jumpers 224, 226, leakage current from history effects in cross coupled NFETs 202, 204 could cause sufficient threshold shift to set initially with the wrong value and after some delay, recover to the correct state. However, the body contacts and jumpers 226, 228 redistributes trapped charge and minimizing history effects. Further, as noted above stability may be improved in the current mirror loads by coupling current mirror driver devices with reference diode devices for a stable, accurate current source.

Thus, the present invention improves high performance SRAMs, especially SOI SRAM bit select and sense amplifier circuits without exceeding circuit real estate budgets. Selectively including body contacts in amplifiers improves sense signal margins and minimizes current mirror variations.

While the invention has been described in terms of preferred embodiments, those skilled in the art will recognize that the invention can be practiced with modification within the spirit and scope of the appended claims.

We claim:

1. An integrated circuit (IC) chip comprising:
    a plurality of devices connected together into a circuit;
    at least two of said plurality of devices being coupled body devices, each coupled body device having body contact connected to another body contact on another said coupled body device, wherein charge induced in each said coupled body device is shared with connected said coupled body devices, history effects being substantially reduced in said coupled body devices; and
    at least one other of said plurality of devices is a floating body devices.

2. An IC as in claim 1, wherein said plurality of devices are field effect transistors (FETs).

3. An IC as in claim 2, further comprising a back bias voltage connected to said body contact at ones of said coupled body FETs.

4. An IC as in claim 3, wherein said back bias voltage is ground.

5. An IC as in claim 2, wherein said IC is a CMOS IC, said CMOS IC further including an array of static random access memory (SRAM) cells.

6. An IC as in claim 5, wherein said IC is on a partially depleted (PD) silicon on insulator (SOI) chip.

7. An IC as in claim 6, wherein said at least two coupled body devices includes a pair of cross coupled FETs.

8. An IC as in claim 7, wherein said cross coupled FETs are NFETs in a sense amplifier.

9. An IC as in claim 2, wherein said at least two includes at least one pair of coupled floating body FETs, charge induced in each of said at least one pair being shared with the other of said at least one pair.

10. A CMOS silicon on insulator (SOI) static random access memory (SRAM), a plurality of FETs connected together forming said CMOS SOI SRAM, a majority of said FETs being floating body FETs, said CMOS SOI SRAM comprising:
   an array of SRAM cells;
   a bit decoder selecting an array column;
   a word decoder selecting an array row;
   a plurality of sense amplifiers sensing data at selected ones of said array cells;
   a data input/output (I/O) driver selectively passing sensed data external to said SRAM and forwarding received data input to said selected ones; and
   a plurality of coupled body FETs, each of said coupled body FETs including a body contact connected to a body contact at another coupled body FET, wherein charge induced in each said coupled body FET is shared with connected said coupled body FETs, history effects being substantially reduced in said coupled body FETs.

11. A CMOS SOI SRAM as in claim 10, said bit decoder comprising:
   a plurality of column select drivers, a selected one of said column drivers selecting said array column, each of said column select drivers comprising a pair of coupled body FETs, a back bias voltage being provided to each of said pair at said body.

12. A CMOS SOI SRAM as in claim 11, wherein said back bias voltage is ground.

13. A CMOS SOI SRAM as in claim 11, wherein said pair of coupled body FETs are connected between a complementary bit line pair and a complementary data in pair, each of said column select drivers further comprising:
   a column restore selectively restoring said complementary bit line pair to an unselected voltage and equalizing voltage differences between said complementary bit line pair;
   a pair of read NFETs selectively coupling said complementary bit line pair to a data line pair; and
   a write control circuit, said pair of coupled body FETs selectively coupling said complementary bit line pair to said complementary data in pair responsive to said write control circuit.

14. A CMOS SOI SRAM as in claim 13, wherein said column restore comprises:
   a first inverter receiving a bit select signal, said first inverter driving the gates of said pair of read NFETs;
   a second inverter receiving the output of said first inverter;
   a pair of restore FETs connected between a supply voltage and said complementary bit line pair, said second inverter driving gates of said pair of restore FETs; and
   an equalization FET connected between said complementary bit line pair, said first inverter driving the gate of said equalization FET.

15. A CMOS SOI SRAM as in claim 14, wherein said write control circuit is a NOR gate receiving said output of said first inverter and a write control signal.

16. A CMOS SOI SRAM as in claim 13, wherein said pair of read NFETs and FETs in each of said column restore and said write control circuit are ones of said floating body FETs.

17. A CMOS SOI SRAM as in claim 10, each of said sense amplifiers comprising:
   a pair of cross coupled NFETs, said cross coupled NFETs being a pair of said coupled body FETs, said body contact of a first of said pair being connected to a body contact of a second of said pair.

18. A CMOS SOI SRAM as in claim 17, wherein said cross coupled NFETs are connected between a complementary pair of data lines and a sense enable node, each of said sense amplifiers further comprising:
   a data line restore selectively restoring said pair of data lines to an unselected voltage and equalizing voltage differences between said pair;
   a pair of cross coupled PFETs connected between said pair of data lines and a supply voltage;
   a sense enable receiving a sense enable signal and driving said sense enable node; and
   a driver receiving sensed data from said pair of data lines and redriving said sensed data.

19. A CMOS SOI SRAM as in claim 18, wherein said data restore comprises:
   a first inverter receiving a restore signal;
   a second inverter receiving the output of said first inverter;
   a pair of restore FETs between a supply voltage and said pair of data lines; and
   an equalization FET connected between said pair of data lines, said second inverter further driving the gate of said pair of restore FETs and said equalization FET.

20. A CMOS SOI SRAM as in claim 18, wherein said sense enable comprises a pair of series connected inverters.

21. A CMOS SOI SRAM as in claim 18, wherein said driver comprises:
   an inverter, one of said pair of data lines driving said inverter; and
   a tristatable driver driven by said first inverter and another of said pair of data lines, said tristatable driver redriving sensed data.

22. A CMOS SOI SRAM as in claim 18, wherein said pair of cross coupled PFETs and FETs in each of said data restore, said sense enable and said driver ones of said floating body FETs.

23. A CMOS SOI SRAM as in claim 10, wherein said CMOS SOI SRAM is on a partially depleted (PD) SOI chip.

24. A partially depleted (PD) CMOS silicon on insulator (SOI) chip, a plurality of FETs connected together forming a circuit on said PD CMOS SOI chip, a majority of said FETs being floating body FETs, said circuit including a static random access memory (SRAM), said SRAM comprising:
   an array of SRAM cells;
   a bit decoder including a plurality of column select drivers each selecting an array column, each of said column select drivers comprising:
       a pair of coupled body FETs, each including a body contact and connected to another coupled body FET, wherein charge induced in each said coupled body FET is shared with connected said coupled body FETs, history effects being substantially reduced in said coupled body FETs, and a back bias voltage being provided to each of said pair at said body;

a word decoder selecting an array row;

a plurality of sense amplifiers sensing data at selected ones of said array cells, each of said sense amplifiers comprising a pair of cross coupled NFETs connected between a complementary pair of data lines and a sense enable node, said cross coupled NFETs being a pair of said coupled body FETs, said body contact of a first of said pair being connected to a body contact of a second of said pair, charge induced into the body of either of said pair being shared by said pair; and a data input/output (I/O) driver selectively passing sensed data external to said SRAM and forwarding received data input to said selected ones.

25. A PD CMOS SOI chip as in claim 24, wherein said back bias voltage is ground.

26. A PD CMOS SOI chip as in claim 24, wherein said pair of coupled body FETs in said bit decoder are connected between a complementary bit line pair and a complementary data in pair, each of said column select drivers further comprising:

a column restore selectively restoring said complementary bit line pair to an unselected voltage and equalizing voltage differences between said complementary bit line pair;

a pair of read NFETs selectively coupling said complementary bit line pair to a complementary data line pair; and a NOR gate receiving an output of said column restore and a write control signal, an output of said NOR gate driving the gates of said pair of coupled body FETs, driven said coupled body FETs coupling said complementary bit line pair to said complementary data in pair.

27. A PD CMOS SOI chip as in claim 26, wherein said column restore comprises:

a first inverter receiving a bit select signal, said first inverter providing said output received by said NOR gate and driving the gates of said pair of read NFETs;

a second inverter receiving the output of said first inverter;

a pair of restore FETs between a supply voltage and said complementary bit line pair, said second inverter driving gates of said pair of restore FETs; and an equalization FET connected between said complementary bit line pair, said first inverter driving the gate of said equalization FET.

28. A PD CMOS SOI chip as in claim 27, each of said sense amplifiers further comprising:

a data line restore selectively restoring said pair of data lines to an unselected voltage and equalizing voltage differences between said pair of data lines;

a pair of cross coupled PFETs connected between said pair of data lines and a supply voltage;

a sense enable receiving a sense enable signal and driving said sense enable node; and a driver receiving sensed data from said pair of data lines and redriving said sensed data.

29. A PD CMOS SOI chip as in claim 28, wherein said data restore comprises:

a first inverter receiving a restore signal;

a second inverter receiving the output of said first inverter;

a pair of restore FETs between a supply voltage and said complementary pair of data lines; and an equalization FET connected between said pair of data lines, said second inverter further driving gates of said pair of restore FETs and the gate of said equalization FET.

30. A PD CMOS SOI chip as in claim 29, wherein said sense enable comprises a pair of series connected inverters.

31. A PD CMOS SOI chip as in claim 28, wherein said driver comprises:

an inverter, one of said pair of data lines driving said inverter; and a tristatable driver driven by said first inverter and another of said pair of data lines, said tristatable driver redriving said sensed data.

* * * * *